(12) United States Patent
Mori et al.

(10) Patent No.: US 10,950,391 B2
(45) Date of Patent: Mar. 16, 2021

(54) PHOTOELECTRIC CONVERSION DEVICE AND MANUFACTURING METHOD AND APPARATUS THEREOF

(71) Applicant: KABUSHIKI KAISHA TOSHIBA, Minato-ku (JP)

(72) Inventors: Shigehiko Mori, Kawasaki (JP); Hideyuki Nakao, Setagaya (JP); Takeshi Gotanda, Yokohama (JP); Haruhi Oooka, Kawasaki (JP); Kenji Todori, Yokohama (JP); Kenji Fujinaga, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/599,146

(22) Filed: Oct. 11, 2019

(65) Prior Publication Data
US 2020/0043672 A1     Feb. 6, 2020

Related U.S. Application Data

(62) Division of application No. 15/919,604, filed on Mar. 13, 2018, now abandoned.

(30) Foreign Application Priority Data

Sep. 15, 2017    (JP) .............................. JP2017-178161

(51) Int. Cl.
*H01G 9/20*      (2006.01)
*H01L 51/00*    (2006.01)
(Continued)

(52) U.S. Cl.
CPC ......... *H01G 9/2022* (2013.01); *H01G 9/0029* (2013.01); *H01G 9/2068* (2013.01);
(Continued)

(58) Field of Classification Search
CPC .. H01G 9/2022; H01G 9/2095; H01G 9/2068; H01G 9/0029; H01L 51/441;
(Continued)

(56) References Cited

U.S. PATENT DOCUMENTS

| 4,795,500 A | 1/1989 | Kishi et al. |
| 5,084,400 A * | 1/1992 | Nath ....................... H01L 21/28 |
| | | 438/88 |

(Continued)

FOREIGN PATENT DOCUMENTS

| JP | 62-178499 U1 | 11/1987 |
| JP | 1-298772 | 12/1989 |

(Continued)

OTHER PUBLICATIONS

Reza Asadpour "Bifacial Si heterojunction-perovskite organic-inorganic tandem to produce highly efficient (~33%) solar cell", Appl. Phys. Lett., 106, 243902 (2015) 106.

*Primary Examiner* — Michael Y Sun
(74) *Attorney, Agent, or Firm* — Oblon, McClelland, Maier & Neustadt, L.L.P.

(57) ABSTRACT

A method for manufacturing a photoelectric conversion device, that includes: forming a laminate structure of a substrate, a transparent electrode, an active layer produced by wet-coating, and a counter electrode, stacked in this order; and thereafter forming a cavity by: (a) pressing an adhesive material just against a defect formed on the surface of said counter electrode, and then peeling off said adhesive material together with said defect and the peripheral part thereof; or (b) sucking a defect formed on the surface of said counter electrode, so as to remove said defect and the peripheral part thereof, where said cavity penetrates through the counter electrode and unreached to the transparent electrode.

10 Claims, 6 Drawing Sheets

(51) Int. Cl.
| | | |
|---|---|---|
| *H01G 9/00* | (2006.01) | |
| *H01L 51/44* | (2006.01) | |
| *H01L 51/42* | (2006.01) | |
| *H01L 21/67* | (2006.01) | |
| *H01L 29/84* | (2006.01) | |
| *H01L 23/40* | (2006.01) | |
| *H01L 21/447* | (2006.01) | |
| *H01L 21/603* | (2006.01) | |
| *H01L 21/768* | (2006.01) | |
| *H01L 21/60* | (2006.01) | |
| *H01L 21/322* | (2006.01) | |
| *H01L 21/66* | (2006.01) | |

(52) U.S. Cl.
CPC ......... *H01G 9/2095* (2013.01); *H01L 51/004* (2013.01); *H01L 51/0034* (2013.01); *H01L 51/424* (2013.01); *H01L 51/441* (2013.01); *H01L 21/3225* (2013.01); *H01L 21/447* (2013.01); *H01L 21/67288* (2013.01); *H01L 21/76882* (2013.01); *H01L 22/24* (2013.01); *H01L 29/84* (2013.01); *H01L 51/0035* (2013.01); *H01L 51/0036* (2013.01); *H01L 51/0037* (2013.01); *H01L 51/0043* (2013.01); *H01L 51/0076* (2013.01); *H01L 51/0081* (2013.01); *H01L 51/0097* (2013.01); *H01L 51/4253* (2013.01); *H01L 2021/603* (2013.01); *H01L 2021/6015* (2013.01); *H01L 2023/4025* (2013.01); *H01L 2224/753* (2013.01); *H01L 2224/7555* (2013.01); *H01L 2224/75302* (2013.01); *H01L 2224/75303* (2013.01); *H01L 2224/7655* (2013.01); *H01L 2224/76301* (2013.01); *H01L 2224/76313* (2013.01); *H01L 2224/773* (2013.01); *H01L 2224/77315* (2013.01); *H01L 2224/77325* (2013.01); *H01L 2251/308* (2013.01)

(58) Field of Classification Search
CPC . H01L 51/424; H01L 51/0034; H01L 51/004; H01L 21/3225; H01L 22/24; H01L 2224/7555; H01L 2224/7655; H01L 2224/76313; H01L 2224/76301; H01L 2224/77315; H01L 2224/77325; H01L 2224/773; H01L 2224/75303; H01L 2224/75302; H01L 29/84; H01L 2023/4025; H01L 21/447; H01L 2224/753; H01L 2021/603; H01L 21/76882; H01L 2021/6015; H01L 21/67288; H01L 51/0097; H01L 51/0036; H01L 51/0081; H01L 2251/308; H01L 51/0043; H01L 51/0037; H01L 51/4253; H01L 51/0035; H01L 51/0076; Y02E 10/549; Y02E 10/542

See application file for complete search history.

(56) References Cited

U.S. PATENT DOCUMENTS

| | | |
|---|---|---|
| 7,281,334 B2 | 10/2007 | Yonezawa et al. |
| 2004/0099862 A1 | 5/2004 | Suzuki et al. |
| 2009/0114279 A1 | 5/2009 | Zhao et al. |
| 2010/0084015 A1 | 4/2010 | Chang et al. |
| 2010/0255631 A1* | 10/2010 | Yagiura ................. H01L 31/186 438/88 |
| 2011/0151591 A1 | 6/2011 | Yamamuro et al. |
| 2011/0192441 A1 | 8/2011 | Strehler et al. |
| 2012/0037225 A1 | 2/2012 | Jee et al. |

FOREIGN PATENT DOCUMENTS

| | | |
|---|---|---|
| JP | 6-275856 | 9/1994 |
| JP | 6-310742 | 11/1994 |
| JP | 2001-127318 A | 5/2001 |
| JP | 2004-115356 | 4/2004 |
| JP | 2004-178986 A | 6/2004 |
| JP | 2007185685 A * | 7/2007 |
| JP | 2009-246122 | 10/2009 |
| JP | 2011-113733 A | 6/2011 |
| JP | 2011-181904 | 9/2011 |
| JP | 2011-243970 | 12/2011 |
| JP | 2012-109421 | 6/2012 |
| JP | 2014-75318 A | 4/2014 |
| JP | 2016-174086 A | 9/2016 |
| WO | WO 2010/023845 A1 | 3/2010 |
| WO | WO 2010/029939 A1 | 3/2010 |
| WO | 2011/001962 A1 | 1/2011 |

\* cited by examiner

PHOTOELECTRIC CONVERSION DEVICE AND MANUFACTURING METHOD AND APPARATUS THEREOF

CROSS-REFERENCE TO RELATED APPLICATIONS

The present application is a divisional of U.S. patent application Ser. No. 15/919,604, filed on Mar. 13, 2018, which is based upon and claims the benefit of priority from the prior Japanese Patent Application No. 2017-178161, filed on Sep. 15, 2017, the entire contents of which are incorporated herein by reference.

FIELD

Embodiments of the present disclosure relate to a photoelectric conversion device and a manufacturing method and apparatus thereof.

BACKGROUND

Photoelectric conversion devices, such as, solar cells, photosensors, light-emitting devices, photodiodes and optical memories, can comprise perovskite or organic materials serving as the photoelectric conversion components. Those are expected as low-cost photoelectric conversion devices because their layers can be formed by inexpensive coating processes.

Perovskite solar cells, which comprise perovskite materials serving as the photoelectric conversion components, have been recently hoped to be low-cost and highly efficient solar cells. As a matter of fact, there is a report that a perovskite solar cell achieved an efficiency of 22%, which is a value approaching the efficiency 25% shown by single crystal silicon solar cells.

When perovskite solar cells are manufactured by a wet-coating process, a roll-to-roll method can be adopted. In the roll-to-roll method, a substrate loaded with layers of the solar cell is transferred around each roll and hence needs to be flexible.

For the flexible substrate, a polymer film is suitably employed. In addition, because a polymer film is generally lighter in weight than a common glass substrate, the resultant solar cell can be potentially installed on curved or poor load-bearing roofs of factories and the like, on which it has been difficult to install conventional solar cells. Thus, there is possibility that perovskite solar cells having polymer film substrates may extend the market of solar cells.

Also as the flexible substrate, a sheet of ultra-thin flexible glass can be adopted. The glass sheet has higher heat and chemical resistance and a smaller thermal expansion coefficient than polymer films, and hence can enlarge the choice of layer materials as compared with polymer films. However, it costs a lot.

A perovskite solar cell generally comprises such components as a substrate/a transparent electrode/a first intermediate layer/a perovskite layer (photoelectric conversion layer)/a second intermediate layer/and a counter electrode.

However, it is known that the perovskite solar cell tends to suffer from defects formed in the production process thereof. Here, the "defects" means spots where the transparent electrode and the counter electrode are locally close to each other with a peculiarly short distance or where they make a direct confined contact with each other. The perovskite layer is so thin at the spots that transmittance there can be visually observed to be high. Those spots are, hence, often also referred to as "pinholes".

When the solar cell is subjected to voltage-current measurement, the defects cause short circuit states and consequently often impair electric properties, particularly, such as open circuit voltage and fill factor.

There are some probable mechanisms for formation of the defects in the perovskite solar cell. For example, the defects may be formed due to conditions of drying the perovskite layer. Specifically, when the perovskite layer formed by wet-coating is dried to remove the solvent, the solvent evaporates preferentially from the layer surface to cause stress difference between the surface and inside of the layer. Thus, the defects are presumed to be formed.

Further, the defects may be formed by particles attached on the substrate surface before the wet-coating process for forming the layer. For example, if the particles have poor wettability to the perovskite coating solution, the defects are thought to be formed at the positions where the solution is repelled by the particles. In addition, when the coating solution is applied, the areas around the particles may be insufficiently supplied with the solution, so that the surface may be coated unevenly to form the defects. Specifically, for example, when the substrate surface is spin-coated with the perovskite coating solution, the solution is evenly spread by centrifugal force. However, if there are some particles on the surface, the areas occupied by the particles are left uncoated. Accordingly, the resultant perovskite layer has relatively thin thickness at the uncoated areas, and consequently the defects tend to be formed there.

In view of the above, it can be thought that the coating and drying conditions are so optimized as to prevent the defects completely. However, it is not realistic to prevent the defects completely. For example, if the coating procedure is carried out according to meniscus coating, slot die coating, screen print coating or the like, the defects seem to be hardly formed because the particles on the substrate surface are covered with the coating film formed by the above processes. Even so, however, as long as the coating solution is used, it is presumed to be difficult to prevent the defects completely. It also seems that the defects are hardly formed by the particles when the perovskite layer is produced by vapor deposition or the like. However, apparatus for vapor deposition increases the cost.

In consideration of those, it is preferred to treat the formed defects and thereby to recover the properties of the device, rather than to prevent formation of the defects.

As the treatment for the defects, it is known to remove the defects and their peripheral parts according to a mechanical scribing or laser scribing process. In the mechanical scribing process, a grooving tool such as a metal taper needle is moved while the bit of the tool is kept pressed against the substrate so as to remove the defect parts. On the other hand, in the laser scribing process, the defect parts are removed by irradiation of scanning laser light.

However, when the defects of the solar cell or the like comprising a film substrate are treated according to the mechanical scribing process, there is a fear that the film substrate may be damaged. It is not easy to find out such conditions that the film substrate is not damaged. Further, it is necessary to recover shavings after scribing. Meanwhile, as for the laser scribing process, apparatus for the process is generally expensive and the film substrate may be deformed by heat when laser light is condensed. Occasionally, the heat generated by condensation of laser light locally melts the metal electrode film (counter electrode), thereby makes a contact between the counter electrode and the transparent electrode and, as a result, short-circuits the solar cell.

DETAILED DESCRIPTION

Embodiments will now be explained with reference to the accompanying drawings.

The photoelectric conversion device according to an embodiment has a laminate structure of
a substrate,
a transparent electrode,
an active layer, and
a counter electrode, stacked in this order; and also has
a cavity provided on the counter electrode-side, wherein said cavity penetrates through the counter electrode,
said cavity has an opening area larger in said counter electrode than in said active layer.

Further, in the photovoltaic module according to another embodiment, a plural number of the above devices are arranged.

Furthermore, the method according to still another embodiment for manufacturing a photoelectric conversion device, comprises the steps of:
forming a laminate structure of
a substrate,
a transparent electrode,
an active layer produced by wet-coating, and
a counter electrode, stacked in this order; and thereafter
(a) pressing an adhesive material just against a defect formed on the surface of said counter electrode, and then peeling off said adhesive material together with said defect and the peripheral part thereof; or
(b) sucking a defect formed on the surface of said counter electrode, so as to remove said defect and the peripheral part thereof.

Still further, the apparatus according to yet another embodiment for manufacturing the above device or the above photovoltaic module, is equipped with
a defect-position determining unit with which positions of defects are determined, and
a defect-removing unit with which said defects are removed.

Embodiments will now be explained with reference to the accompanying drawings.

First Embodiment

Figure 1:
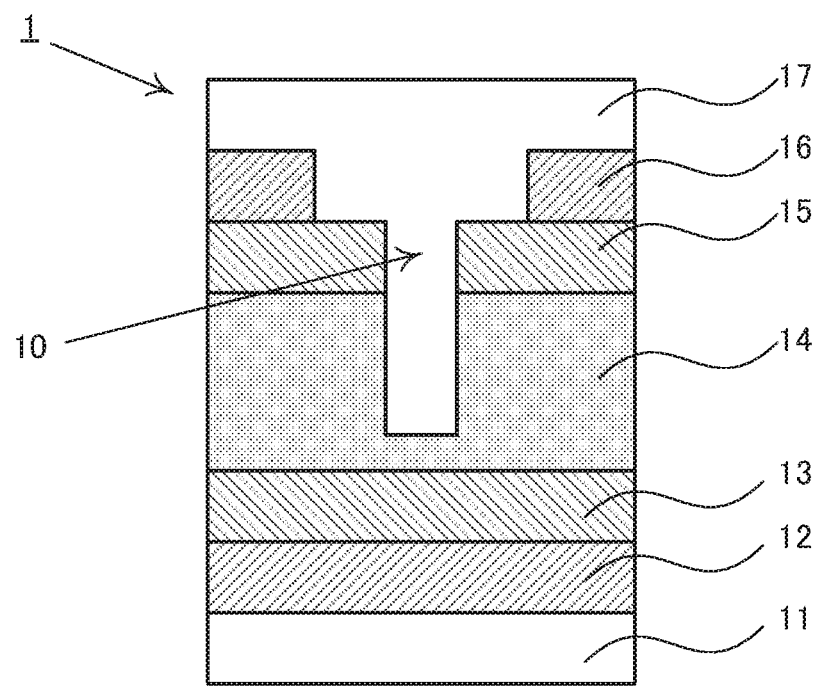
FIG. 1 is a schematic sectional view of the photoelectric conversion device according to an embodiment.

FIG. 1 is a schematic sectional view of a photoelectric conversion device 1 according to the first embodiment.

Hereinafter, photoelectric conversion devices are often referred to simply as "devices" for the purpose of simplification. The device of the present embodiment comprises a substrate 11, a transparent electrode 12, a first intermediate layer 13, a photoelectric conversion layer 14, a second intermediate layer 15, a counter electrode 16, and a sealing layer 17 in this order. Among them, the first and second intermediate layers 13 and 15 are optionally provided according to necessity. The transparent electrode is provided on the substrate, and the first intermediate layer is provided on the transparent electrode. The photoelectric conversion layer is provided on the first intermediate layer, and comprises, for example, a perovskite compound. The second intermediate layer is provided on the photoelectric conversion layer, and the counter electrode is provided on the second intermediate layer. In addition, the device has a cavity 10 penetrating through the counter electrode 16 to the photoelectric conversion layer 14. Further, the sealing layer 17 is provided on the counter electrode. The component members constituting the device according to the present embodiment are individually described below in detail.

(Substrate)

The substrate 11 supports other component members. The substrate can be made of any materials selected from known ones used for conventional photoelectric conversion devices. However, incident light needs to pass through the substrate and to reach the photoelectric conversion layer so that the device of the embodiment can work effectively. In view of that, the substrate is preferably made of a highly transparent material.

Further, the substrate has a surface on which the electrode can be formed, and accordingly is preferably not impaired by heat and organic solvents. The substrate material may be either inorganic or organic one. However, when the device is manufactured according to the roll-to-roll method, the substrate is preferably flexible. The flexible substrate is also preferred because the device can be made flexible to expand the practical application thereof. In addition, if the substrate has high transparency, the device can have improved properties. In view of those, organic substances are preferably adopted as the material of the support.

Preferred examples of materials having both transparency and flexibility include: organic substances, such as, polyethylene naphthalate (heat-resistant temperature: about 160° C.), polyethylene terephthalate (heat-resistant temperature: about 105° C.), polyethylene (heat-resistant temperature: about 60 to 100° C.), polyimide (heat-resistant temperature: about 240° C.), polyamide (heat-resistant temperature: about 100 to 150° C.), polyamide-imide (heat-resistant temperature: about 240° C. or below), polyester, polycycloolefin and liquid crystal polymers. When the substrate is made of an organic material, the material preferably has a heat-resistant temperature of 240° C. or below although the heat-resistant temperature depends on the blending ratio of polymers or on the polymerization ratio of copolymer.

According to necessity, the substrate may be made of an inorganic material, which has high heat and chemical resistance. However, even if made of an inorganic material, the substrate also preferably has high transparency. Accordingly, it is possible to use a flexible and semitransparent substrate made of a void-containing or ultrathin inorganic material. Examples of inorganic materials include non-alkali glass and quartz glass.

There are no particular restrictions on the thickness of the substrate as long as it has enough strength to support other component members. For example, the substrate material may have flexibility.

If made of a flexible material, the substrate 11 may be placed on another highly rigid support, such as a glass plate, so as to stably carry out film-forming steps in the production process of the device. After the device is produced, the support can be separated from the substrate.

The substrate is positioned on the light-incident side of the device, and hence it is possible to provide an antireflection film of, for example, moth-eye structure on the light-incident surface. The antireflection film enables incident light to enter the device efficiently and thereby can improve the energy conversion efficiency of the device. The moth-eye structure has a surface on which convexes of about 100 nm height are regularly arranged. Because of this convex structure, the refractive index continuously changes along the thickness direction. As a result, the film reduces reflection of the incident light.

(Transparent Electrode)

The transparent electrode is, for example, an electroconductive metal oxide film or a semitransparent metal thin film.

Concrete examples of the film include: electroconductive glass films comprising indium oxide, zinc oxide, tin oxide or a composite thereof, such as, indium-tin oxide (ITO) and fluorine-doped tin oxide (FTO); or tin oxide films made of electroconductive glass comprising indium, zinc and oxide thereof. Among them, a film of ITO is particularly preferred. An ITO electrode is known to have high light transparency, low sheet resistivity, and small surface roughness.

Further, the electrode may be a semitransparent thin film of metal, such as, gold, platinum, silver or copper.

The thickness of the transparent electrode can be properly determined in consideration of the transparency and electroconductivity of the electrode and the flexibility of the device. There are no particular restrictions on the thickness of the transparent electrode. However, if made of ITO, the electrode has an average thickness of preferably 300 nm or less, more preferably 150 nm or less. Even if the thickness is 150 nm, the ITO electrode can achieve a sufficient conversion efficiency.

(First and Second Intermediate Layers)

The first and second intermediate layers 13 and 15 are optionally formed according to necessity. Each layer serves as, for example, a hole transport layer or an electron transport layer. According to the structure of the photoelectric conversion layer or the like, they are individually installed appropriately. For example, if the first intermediate layer 13 serves as a hole transport layer, it has functions of blocking electrons generated in the photoelectric conversion layer 14 and of transferring positive holes selectively and efficiently to the transparent electrode 12. On the other hand, in that case, the second intermediate layer 15 works as an electron transport layer, which has functions of blocking holes generated in the conversion layer 14 and of transferring electrons selectively and efficiently to the counter electrode 16.

The first and second intermediate layers 13 and 15 are made of materials according to the aimed functions. They are selected from organic materials, inorganic materials or composite materials of both.

Examples of the organic materials usable in those layers according to the embodiment include: electroconductive polymers, such as, polyaniline and derivatives thereof, polythiophene and derivatives thereof, polyethylenedioxythiophene: polystyrenesulfonic acid (PEDOT:PSS), and fullerenes. Examples of the fullerenes include: unmodified fullerenes, such as $C_{60}$, $C_{70}$, $C_{76}$, $C_{78}$ and $C_{84}$; hydrogenated fullerenes, such as $C_{60}H_{36}$ and $C_{70}H_{36}$: oxide fullerenes of $C_{60}$ and $C_{70}$; fullerene metal complexes; and other fullerene derivatives, such as, [6,6]-phenyl$C_{61}$butyric methyl ester (60PCBM), [6,6]-phenyl$C_{71}$butyric methyl ester (70PCBM), and bisindene $C_{60}$ (60ICBA).

Examples of the inorganic materials usable in the first or second intermediate layer according to the embodiment include: oxides, such as, titanium oxide, zinc oxide, molybdenum oxide, tungsten oxide, aluminum oxide, copper oxide, vanadium oxide, nickel oxide, lithium oxide, calcium oxide, and cesium oxide; lithium fluoride (LiF); and metal calcium.

The first and second intermediate layers may individually have laminate structures of stacked plural sublayers, and further another third intermediate layer may be provided according to the purpose.

(Active Layer)

There are no particular restrictions on the active layer 14 in the device according to the embodiment as long as it has a photoelectric conversion function. It may generate electricity under excitation by incident light (photoelectric conversion layer), or it may emit light under application of voltage (luminous layer or light-emitting layer). However, in order to produce a flexible device, the active layer preferably contains a perovskite compound and/or an organic substance.

[Photoelectric Conversion Layer containing a Perovskite Compound]

The following explains a photoelectric conversion layer 14 in which a perovskite compound is employed. The device according to the embodiment preferably comprises an active layer containing a perovskite compound.

The perovskite compound-containing photoelectric conversion layer 14 can be formed by a wet-coating process from a perovskite-material solution described below. The perovskite-material solution comprises a solvent and perovskite crystallites dissolved or dispersed therein. A typical perovskite crystallite has a composition represented by the following formula (1): $ABX_3$ (1); and has a three-dimensional crystal structure.

In the formula (1), A is a monovalent cation of amine compound, B is a divalent metal cation, and X is a monovalent anion of halogen.

The perovskite crystal structure is categorized into 4 types, namely, 0- to 3-dimensional structures. Among them, preferred are the 2- and 3-dimensional structures having compositions represented by $A_2BX_4$ and $ABX_3$, respectively, because they are advantageous in obtaining a highly efficient photoelectric conversion component and a device comprising that.

It is known that the binding energy of excitons is low in the 3-dimensional structure, which is hence favorable for producing a highly efficient photoelectric conversion component or device. The perovskite crystal is known to have a 2- or 3-dimensional structure when the A ion has a large or small ionic radius, respectively.

Specifically, the perovskite crystal in 3-dimensional structure is empirically known to be formed when the A ion has such an ionic radius that the tolerance factor t may be in the range of t=0.75 to 1.1. Here, the tolerance factor t is a value represented by the following formula (2) in which the ionic radii are Shannon's ones although there are some kinds of ionic radii.

$$t=(\text{ionic radius of }A+\text{ionic radius of }B)/\{2^{1/2}\times(\text{ionic radius of }B+\text{ionic radius of }X)\} \quad (2)$$

In order to satisfy the above condition of the A ion, the A ions in the crystals are monovalent cations of amine compounds, metals or mixture of both. If the A ion is a monovalent cation of amine compound, the compound is preferably at least one selected from the group consisting of methylammonium ($CH_3NH_2$) and formamidinium ($NH_2CHNH$). If the A ion is a monovalent cation of metal, the metal is preferably at least one selected from the group consisting of cesium (Cs), rubidium (Rb), potassium (K), lithium (Li) and sodium (Na). The B and X ions are a divalent metal cation and a monovalent anion of halogen, respectively. The B ion is preferably at least one selected from the group consisting of ions of lead (Pb), tin (Sn) and magnesium (Mg), and the X ion is preferably at least one selected from the group consisting of ions of iodine (I), bromine (Br) and chlorine (Cl). They realize high photoelectric conversion efficiency.

Examples of the solvent used in the perovskite-material solution include: N,N-dimethylformamide (DMF), dimethyl sulfoxide (DMSO), N-methyl-2-pyrrolidone (NMP), N,N-dimethylacetamide (DMA), acetone, and acetonitrile. Those solvents can be used singly or in mixture. The solvent is not particularly restricted as long as it can dissolve or disperse the perovskite material homogeneously.

[Photoelectric Conversion Layer containing an Organic Substance]

The following explains a photoelectric conversion layer 14 which has a heterojunction or bulkheterojunction structure comprising an organic substance.

A typical bulkheterojunction-type photoelectric conversion layer 14 usable in the embodiment contains microlayer-separated structures in which a p-type semiconductor (electron donor) and an n-type semiconductor (electron acceptor) are mixed. Among the mixed p-type and n-type semiconductors in the conversion layer 14, pn-junctions of nano-order size are formed. Accordingly, photocharge separation at the junction interfaces can be utilized to extract an electric current. The p-type semiconductor comprises an electron donating material while the n-type one comprises an electron accepting material. In the embodiment, organic semiconductors may be used as both or either of the p-type and/or n-type semiconductors.

Examples of the p-type organic semiconductors include: polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinyl carbazole and derivatives thereof, polysilane and derivatives thereof, polysiloxane derivatives having aromatic amines in their main or side chains, polyaniline and derivatives thereof, phthalocyanine derivatives, porphyrin and derivatives thereof, polyphenylenevinylene and derivatives thereof, polythienylenevinylene and derivatives thereof, benzodithiophene derivatives, and thieno[3,2-b]thiophene derivatives. Those substances may be combined to use as the p-type organic semiconductors. Further, it is also possible to use copolymers composed of the above substances. Examples of the copolymers include thiophene-fluorene copolymer and phenyleneethynylene-phenylenevinylene copolymer.

Preferred p-type organic semiconductors are electroconductive polymers containing n-conjugated systems, such as, polythiophene and derivatives thereof, which ensure relatively excellent steric regularity and have relatively high solubility to solvents. The polythiophene and derivatives thereof are not particularly restricted as long as they have thiophene skeletons. Examples of the polythiophene and derivatives thereof include: polyalkylthiophenes, polyarylthiophenes, polyalkylisothionaphthenes, and polyethylenedioxythiophenes. Examples of the polyalkylthiophenes include: poly3-methylthiophene, poly3-butylthiophene, poly3-hexylthiophene, poly3-octylthiophene, poly3-decylthiophene, and poly3-dodecylthiophene. Those are polyalkylthiophenes ("P3AT") which have substituents at their 3-positions. Examples of the polyarylthiophenes include: poly3-phenylthiophene and poly3-(p-alkylphenylthiophene). Examples of the polyalkylisothionaphthenes include: poly3-butylisothionaphthene, poly3-hexylisothionaphthene, poly3-octylisothionaphthene, and poly3-decylisothionaphthene.

Further, recently, other derivatives, such as PCDTBT (poly[N-9"-hepta-decanyl-2,7-carbazole-alt-5,5-(4',7'-di-2-thienyl-2',1',3'-benzothiadiazole)]), which is a copolymer of carbazole, benzothiadiazole and thiophene, have been known as compounds capable of realizing excellent photoelectric conversion efficiency. Furthermore, also preferred are copolymers of benzodithiophene (BDT) derivatives and thieno[3,2-b]thiophene derivatives. Preferred examples thereof include: poly[4,8-bis[(2-ethylhexyl)oxy]benzo-[1,2-b:4-5-b']dithiophene-2,6-dyl]][3-fluoro-2-[(2-ethylhexyl)-carbonyl]thieno[3,4-b]thiophenedyl]] (PTB7); and PTB7-Th (often referred to as "PCE10" or "PBDTTT-EFT), which contains thienyl group having weak electron-donating ability in place of the alkoxy group in PTB7.

The n-type semiconductor is preferably fullerene or derivatives thereof but not particularly limited to them. Examples thereof include derivatives having basic skeletons of $C_{60}$, $C_{70}$, $C_{76}$, $C_{78}$ or $C_{84}$. In those fullerene derivatives, carbon atoms in the fullerene skeletons may be modified with any functional groups, which may connect to each other to form ring structures. The fullerene derivatives include fullerene-containing polymers. The fullerene derivatives preferably contain functional groups having enough high compatibility with solvents to be very soluble therein.

Examples of the functional groups in the fullerene derivatives include: hydrogen atom; hydroxyl group; halogen atoms, such as, fluorine and chlorine; alkyl groups, such as, methyl and ethyl; alkenyl groups, such as, vinyl; cyano group; alkoxy groups, such as, methoxy and ethoxy; aromatic hydrocarbon groups, such as, phenyl and naphthyl; and aromatic heterocyclic groups, such as, thienyl and naphthyl. Concrete examples of the fullerene derivatives include: hydrogenated fullerenes, such as, $C_{60}H_{36}$ and $C_{70}H_{36}$; oxide fullerenes having basic skeletons of $C_{60}$, $C_{70}$ and the like; and fullerene metal complexes.

Further, if the n-type semiconductor is selected from unmodified fullerenes, an unsubstituted fullerene $C_{70}$ is preferably employed because it efficiently generates photocarriers and hence is suitably adopted in an organic thin-film solar cell. On the other hand, if it is selected from fullerene derivatives, it is particularly preferred to use 60PCBM or 70PCBM in an organic thin-film solar cell.

The photoelectric conversion layer 14 contains the n- and p-type organic semiconductors preferably in such a mixing ratio that the relative weight of the n-type one may be 0.5 to 4.0 provided that the relative weight of the p-type one is assumed to be 1. If the p-type semiconductor is P3AT or the like, the ratio of n type:p type is preferably about 1:1. If PCDTBT or the like is adopted as the p-type semiconductor, the ratio of n type:p type is preferably about 4:1. If the p-type semiconductor is PCE-10 or the like, the ratio of n type:p type is preferably about 1 to 3:1, more preferably 1.5:1.

Examples of the solvents used in the organic material solution include: unsaturated hydrocarbons, halogenated aromatic hydrocarbons, halogenated saturated hydrocarbons, and ethers. Examples of the unsaturated hydrocarbons include: toluene, xylene, tetracene, decalin, mesitylene, n-butylbenzene, sec-butylbenzene, and tert-butylbenzene. Examples of the halogenated aromatic hydrocarbons include: chlorobenzene, dichlorobenzene, and trichlorobenzene. Examples of the halogenated saturated hydrocarbons include: tetrachlorocarbon, chloroform, dichloromethane, dichloroethane, chlorobutane, bromobutane, chloropentane, chlorohexane, bromohexane, and chlorocyclohexane. Examples of the ethers include: tetrahydrofuran and tetrahydropyran. Particularly preferred are halogenated aromatic hydrocarbons. Those solvents can be use singly or in combination. There are no particular restrictions on the solvent as long as it can dissolve or disperse the organic substances homogeneously.

The coating solution can be applied to form the layer by, for example, spin coating, dip coating, casting, bar coating, roll coating, wire-bar coating, spraying, screen printing, gravure printing, flexo printing, offset printing, gravure offset printing, dispenser application, nozzle coating, capillary coating, or ink-jet method. In the embodiment, those coating methods can be used singly or in combination. The photoelectric conversion layer preferably has a thickness of 10 to 1000 nm.

(Counter Electrode)

The counter electrode 16 is made of electroconductive and, if necessary, transparent materials. Examples of the materials for the counter electrode 16 include: metals, such as, silver, gold, aluminum, copper, titanium, platinum, nickel, cobalt, iron, manganese, tungsten, zirconium, tin, zinc, indium, chromium. lithium, sodium, potassium, rubidium, cesium, calcium, magnesium, barium, samarium, and terbium; alloys containing them; electroconductive metal oxides, such as, ITO and indium-zinc oxide (IZO); electroconductive polymers, such as, PEDOT:PSS; and carbon materials, such as, graphene, carbon nanotube and carbon paste. The counter electrode 16 can be formed by a process of vacuum film-formation, such as, vacuum deposition or sputtering; by a sol-gel process; or by a wet-coating process. The method for forming the counter electrode 16 is appropriately selected according to the adopted materials.

(Sealing Layer)

According to necessity, the device according to the embodiment can comprise a sealing layer. The sealing layer 17 functions as a protective layer providing durability to the device. The sealing layer 17 preferably transmit visible light (wavelength: 360 to 830 nm) so as not to interfere with light absorption of the device. There is no upper limitation on the visible light transmittance, which is preferably 60% or more. The thickness of the sealing layer 17 is not particularly restricted, but is normally 1 μm or more.

There are still also no particularly restrictions on the material of the sealing layer 17 as long as it has the above properties, and it is possible to adopt sealants generally used for sealing inorganic or organic solar cells and inorganic or organic LED devices. The usable sealants are, for example, UV-curable resin composition and thermoplastic resin compositions. Examples thereof include: ethylene-vinyl acetate copolymer (EVA) resin composition, hydrocarbon resin composition, epoxy resin composition, polyester resin composition, acrylic resin composition, urethane resin composition and silicon resin composition.

The sealing layer may be an inorganic film, such as, a film of metal oxide, metal fluoride, metal nitride or metal oxidenitride. Examples thereof include: films of vanadium oxide ($V_2O_5$), zinc oxide (ZnO), lithium fluoride (LiF) and silicon oxidenitride (SiON).

(Structure)

The photoelectric conversion device 1 according to the embodiment has a laminate structure in which the above layers are stacked, and is characterized in that a cavity 10 is provided on the counter electrode-side. This cavity penetrates through the counter electrode 16 to form an opening. In FIG. 1, the cavity further penetrates through the second intermediate layer 15 and reaches to the active layer 14.

Figure 2:
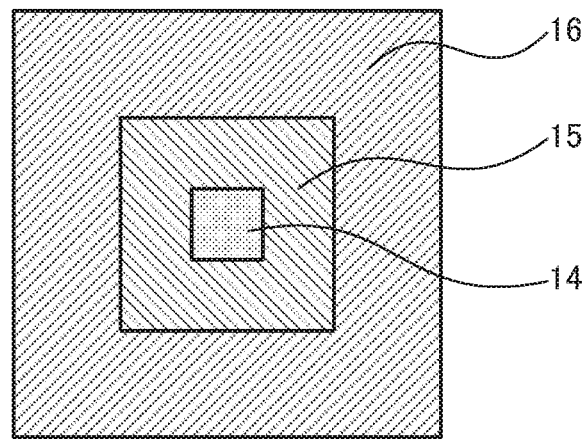
FIG. 2 is a schematic plane view of the photoelectric conversion device according to the embodiment.
Figure 3:
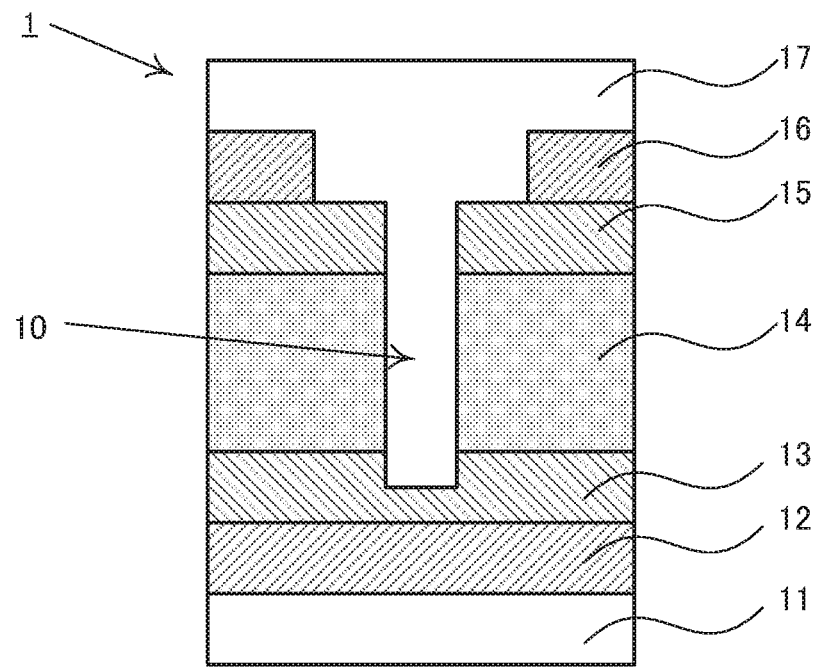
FIG. 3 is a schematic sectional view of the photoelectric conversion device according to another embodiment.
Figure 4:
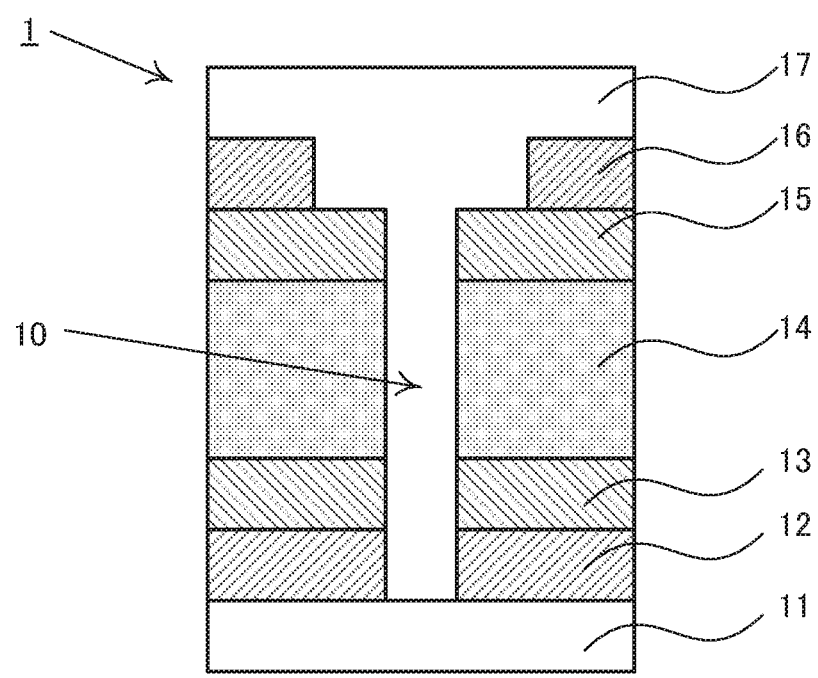
FIG. 4 is a schematic sectional view of the photoelectric conversion device according to still another embodiment.

FIG. 2 is a schematic plane view in which the cavity 10 is seen from the counter electrode-side. The second intermediate layer 15 is exposed to the opening formed on the counter electrode 16, and the active layer 14 is exposed to the opening formed on the second intermediate layer 15. If the second intermediate layer 15 is not provided, the stepwise difference in the active layer 14 can be seen. The cavity may be formed so deeper that the first intermediate layer 13 or the transparent electrode can be exposed to the bottom (FIGS. 3 and 4). However, if the cavity reaches to the substrate 11, the substrate may be damaged in the production process to lower the strength of the whole device. Accordingly, the cavity preferably does not reach to the substrate. Here, it is noted that electroconductive parts originating from the counter electrode, that is, fragments of the counter electrode material filling defects formed in the active layer, must not remain on the bottom of the cavity.

As described later in detail, the opening is formed by removing a defect, which is formed in the wet-coating process, and peripheral area thereof. Accordingly, the opening area depends on the size of the defect. The opening area is, hence, not limited. However, if the opening area is too large, the photoelectric conversion device may be adversely affected in extraction of electric current. In view of that, the opening area in the counter electrode is normally 4 $mm^2$ or less. On the other hand, however, when the cavity is formed by an adhesive method (tape method) described later, it is difficult to control the processing procedures if the opening area is too small. Accordingly, it is normally 1 $mm^2$ or more.

In the device according to the embodiment, the opening area in the active layer is smaller than that in the counter electrode. This structure can further reduce short-circuit risk. Specifically, in the embodiment, the defect formed in the wet-coating process is removed, so that the cavity is formed at a position where the defect is removed. The risk of short circuit is reduced by thus removing the part where the transparent electrode and the counter electrode are locally close to each other with a peculiarly short distance. However, if the resultant cavity keeps the same opening area from the counter electrode to the active layer, that is, if the opening area in the active layer is the same as that in the counter electrode, the distance between the counter electrode and the transparent electrode may be close enough to short-circuit. In contrast, in the embodiment, the active layer and the counter electrode have different opening areas and hence there is a stepwise difference therebetween. Because of the stepwise difference, the counter electrode and the transparent electrode are separated enough to further reduce the risk of short-circuit.

Figure 5:
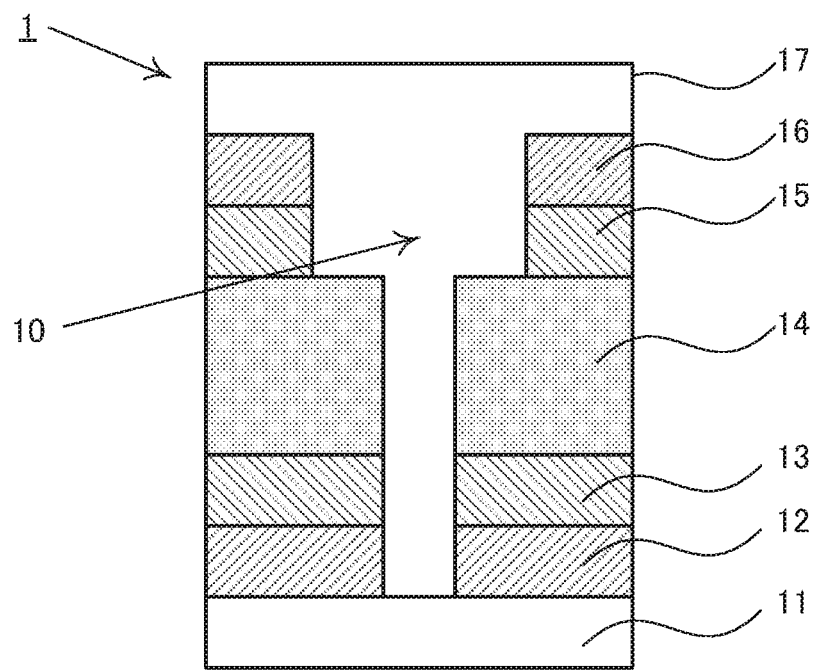
FIG. 5 is a schematic sectional view of the photoelectric conversion device according to yet another embodiment.

That effect of the stepwise difference is obtained by the structure in which the opening area of the counter electrode is larger than that of the lower layers. Accordingly, for example, if the second intermediate layer is placed between the active layer and the counter electrode, the second intermediate layer and the counter electrode may have different opening areas as shown in FIG. 1 or otherwise the second intermediate layer and the active layer may have different opening areas as shown in FIG. 5. Further, all of them may have different opening areas.

The above structure can be readily produced by a tape method described later.

The opening schematically shown in FIG. 2 has a rectangular shape, but is not limited to that. It may have a polygonal or circular shape. Further, in FIG. 1, the cavity is filled with the optionally formed sealing layer. If the cavity is thus inlaid with the sealing layer, short-circuit is further reduced. However, the sealing layer is not necessarily deeply inlaid in the cavity. There may be a void inside the cavity or the sealing layer filling the cavity may have an opened concave at the cavity position.

Second Embodiment

Light-emitting devices, particularly, organic electroluminescent devices (hereinafter, often referred to as "OLEDs") have been developed for the purpose of application for illumination or display backlights.

The OLED is a device comprising a luminous layer which emits light when electrons and positive holes are injected thereinto. Accordingly, although the energy process proceeds reversely, the electroluminescent device has a structure similar to a solar cell and hence many materials of the layers in the OLED are the same as those in perovskite solar cells and organic thin-film solar cells.

The light-emitting device according to the second embodiment is explained below with reference to the accompanying drawings.

Figure 6:
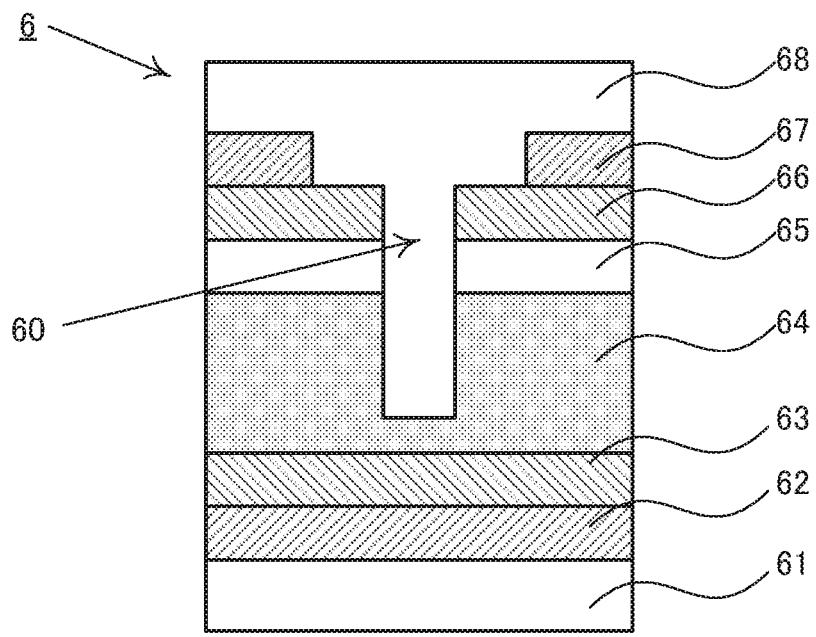
FIG. 6 is a schematic sectional view of the OLED according to an embodiment.

FIG. 6 is a schematic sectional view of the organic electroluminescent device 6 according to the embodiment. The OLED shown in FIG. 6 has a laminate structure of: a substrate 61, an anode (transparent electrode) 62, a hole transport layer 63, an active layer (luminous layer) 64, an electron transport layer 65, an electron injection layer 66, a cathode (counter electrode) 67, and a sealing layer 68, stacked in this order. The hole transport layer 63 corresponds to the first intermediate layer, and the electron transport layer 65 and the electron injection layer 66 correspond to the second intermediate layer. They are optionally formed according to necessity.

(Substrate)

As the substrate, the same materials as described in the first embodiment can be employed. In order to efficiently extract light from the luminous layer, the substrate surface of OLED can be coated with, for example, a film having rugged structure (rugged film). If the substrate surface is thus modified with a proper structure, the refractive index difference between the outside (air) and the rugged film can be continuously changed to improve the light-extraction efficiency. Further, if the material of the rugged film is so selected as to have a refractive index near to that of the substrate, the light-extraction efficiency is further improved.

(Anode)

The anode 62 injects holes into the hole transport layer 63 or the luminous layer 64. Light emitted from the luminous layer is extracted from the substrate 54-side, and hence the anode preferably has high transparency. The anode material is selected in consideration of that, and hence is, for example, an electroconductive metal oxide film, a semi-transparent metal thin film or the like. Concrete examples thereof are the same as those explained in the first embodiment.

(Hole Transport Layer)

The hole transport layer 63 is optionally provided between the anode 62 and the luminous layer 64. The hole transport layer 63 has a function of receiving holes from the anode 62 and of transporting them to the luminous layer 64.

The material of the hole transport layer 63 is, for example, polythiophene-type polymers, such as PEDOT:PSS, but not limited to them.

(Luminous Layer)

The material of the luminous layer 64 can be freely selected from substances used in OLEDs, and may be a fluorescent substance, a phosphorescent substance, a low molecular-weight substance or a polymer substance. Examples of the material include:

blue-light emitting substances, such as, 4,4'-bis(9-ethyl-3-carbazovinylene)-1,1'-biphenyl (BCzVBi), bis(3,5-difluoro-2-(2-pyridyl)phenyl-(2-carboxypyridyl)iridium (III) (Firpic), and bis(2,4-difluorophenylpyridinato)tetrakis(1-pyrazolyl)borate iridium(III) (Flr6);

green-light emitting substances, such as, tris(8-quinolinolato)aluminum (Alq3), 2,3,6,7-tetrahydro-1,1,7,7-tetramethyl-1H,5H,11H-10-(2-benzothiazolyl)quinolizino-[9,9a,1gh]coumarin (C545T), and tris(2-phenylpyridinato)iridium(III) (Ir(ppy)3); and red-light emitting substances, such as, 4-(dicyanomethylene)-2-methyl-6-(4'-dimethylaminostyryl)-4H-pyran (DCM1), 4-(dicyanomethylene)-2-tert-butyl-6-(1,1,7,7-tetramethyl-julolidyl-4-yl-vinyl)-4H-pyran (DCJTB), and 2,3,7,8,12,13,17,18-octaethyl-21H,23H-porphyrin platinum (II) (PtOEO).

The light-emitting substance is not limited to those, and can be freely selected.

The thickness of the luminous layer can be freely selected according to the aimed purpose, but is preferably 10 to 100 nm.

(Electron Transport Layer)

The electron transport layer 65 is optionally formed on the luminous layer 64 according to necessity. The electron transport layer 65 has a function of receiving electrons from the electron injection layer 66 and of transporting them to the luminous layer 64. The material of the electron transport layer 65 is, for example, tris(2,4,6-trimethyl-3-(pyridin-3-yl)phenyl)borane (3TPYMB), tris(8-quinolinato)aluminum complex (Alq3), or bathophenanthroline (BPhen), but not limited to them.

(Electron Injection Layer)

The electron injection layer 66 is optionally formed on the electron transport layer 65 according to necessity. The electron injection layer 66 has a function of receiving electrons from the cathode 67 and of injecting them into the electron transport layer 65 or the luminous layer 64.

The material of the electron injection layer 66 is, for example, CsF or lithium fluoride (LiF), but not limited to them.

(Cathode)

The cathode 67 is formed on the luminous layer 64 (or on the electron transport layer 65 or on the electron injection layer 66). The cathode 67 has a function of injecting electrons into the luminous layer 64 (or into the electron transport layer 65 or into the electron injection layer 66).

If the light-emitting device of the embodiment is so designed that light can be extracted from the cathode-side, the cathode is generally made of a transparent or semi-transparent material. Accordingly, the material is, for example, a highly transparent and electroconductive metal oxide or metal film.

If the anode 61 is made of a material having a high work function, the cathode 67 is preferably made of a material having a low work function. The material of low work function is, for example, an alkali metals or alkaline earth metal. Examples thereof include Li, In, Al, Ca, Mg, Na, K, Yb and Cs.

The cathode 67 may be a single layer, or may consist of stacked plural sublayers made of materials having different work functions. Further, alloys of two or more metals can be employed. Examples of the alloys include: lithium-aluminum alloy, lithium-magnesium alloy, lithium-indium alloy, magnesium-silver alloy, magnesium-indium alloy, magnesium-aluminum alloy, indium-silver alloy, and calcium-aluminum alloy.

The thickness of the cathode 67 can be freely selected according to the aimed purpose, but is preferably 10 to 150 nm. If the thickness is thinner than the above, the resistance often increases. On the other hand, if the thickness is too thick, it takes such a long time to form the cathode 67 that the adjacent layer may be damaged to deteriorate the performance. It is necessary to pay attention to that.

(Sealing Layer)

The light-emitting device optionally comprises a sealing layer 68 according to necessity. The sealing layer functions as a protective layer providing durability to the device. The sealing layer can be formed from the same materials as those described in the first embodiment.

(Structure)

The light-emitting device according to the embodiment has a cavity on the cathode-side, and the structure thereof is the same as that described in the first embodiment. The cavity penetrates through the cathode 67 and reaches to the luminous layer 64 or the hole transport layer 63, so as to prevent short-circuit between the anode 62 and the cathode 67. As an effect of the cavity, voltage is applied to the luminous layer so efficiently that the device can emit light with high luminous efficiency.

[Method for Manufacturing a Photoelectric Conversion Device]

The photoelectric conversion device according to the embodiment can be manufactured in a desired manner. However, the device is preferably manufactured by the steps of: producing a defect-containing device by a generally known method and thereafter treating formed defects. The method for manufacturing a photoelectric conversion device is explained below. In the method described below, the device is a solar cell and the defects are treated by a tape method.

First, a device containing defects to treat is produced according to a usual method.

A transparent electrode is formed on a substrate. Specifically, the transparent electrode is formed from a transparent or semitransparent electroconductive material by vacuum deposition, sputtering, ion-plating, normal plating, wet-coating or the like. The procedure for forming an ITO transparent electrode is explained below as an example.

If the substrate is made of a low heat-resistant organic material, the ITO layer can be formed, for example, in the following manner. First, ITO is accumulated on the substrate by vacuum deposition or sputtering at as low a temperature as 100° C. or below, to form a film. Since deposited at a low temperature, the ITO film does not have a crystal phase but an amorphous phase. Further, since not exposed to a high temperature, the substrate serving as an undercoat layer is hardly damaged. However, the amorphous phase ITO has poor chemical resistance, and hence tends to be damaged if the first intermediate layer is formed thereon from a strongly acidic material, such as, PEDOT:PSS.

In order to cope with that, the ITO layer is annealed to convert the amorphous phase into the crystal phase. The annealing treatment can improve the chemical resistance, namely, acid resistance of the ITO layer. The annealing treatment is preferably carried out at a relatively low temperature. Specifically, the annealing temperature is preferably 200° C. or below, more preferably 150° C. or below. The annealing time is preferably 0.5 to 6 hours, more preferably 1 to 3 hours so as to grow the crystal phase sufficiently. In the embodiment, since the annealing treatment is thus carried out at a relatively low temperature, the process cost can be reduced and also the substrate is hardly damaged even if made of an organic material.

The annealing treatment thus converts the amorphous phase into the crystal phase. In view of that, the composition of ITO is preferably so controlled that the conversion can proceed advantageously. Specifically, the crystallization starting temperature of ITO can be controlled by adjusting the doping ratio of Sn to $In_2O_3$. If the doping ratio of Sn to $In_2O_3$ is a large value, impurities are contained in a large amount and consequently the crystallization starting temperature of ITO becomes high. The present applicant has studied and found that, when the weight ratio of In/Sn is 24 (In:Sn=96 mass %:4 mass %) or more, the ITO crystallization starting temperature is 140 to 150° C. The ITO crystallization starting temperature is also found to be about 180° C. under the condition that the weight ratio of In/Sn is 13 (In:Sn=93 mass %:7 mass %).

The ITO layer generally does not contain metal elements except In, Sn and other inevitable impurities. However, as long as the effect of the embodiment is not impaired, the ITO layer may contain metal elements other than In or Sn. Specifically, the layer may contain Ce, Ti, Ga, Zn, W or the like (which are hereinafter collectively referred to as "metal atom M"). The content of the metal atom M is preferably 5.0 atom % or less, more preferably 0.5 atom % or less in terms of atomic ratio of: metal atom x/(In+metal atom M).

The above process thus makes it possible to form a highly acid-resistant ITO film readily at a low cost without thermally damaging the substrate even if the substrate is made of an organic material or the like.

Subsequently, if necessary, the first intermediate layer is formed. Specifically, the first intermediate layer can be formed by a process of vacuum film-formation, such as, vacuum deposition or sputtering; by a sol-gel process; or by a wet-coating process, according to the adopted material. Even when the first intermediate layer is formed from materials which may damage ITO in amorphous phase, the above process is adopted to form the ITO layer so that the device can be produced without impairing the properties thereof.

When the first intermediate layer is formed by a wet-coating process, such as, spin-coating, the coating solution is applied to form a film of desired thickness and then generally heated to dry on a hot-plate or the like. The coating solution may be beforehand filtrated through a filter.

Thereafter, the active layer is formed. The method for forming the active layer can be freely selected from generally known processes, such as, spin-coating or vacuum deposition.

If the spin-coating process is adopted, the coating solution containing a light-emitting substance is applied to form a film of desired thickness and then generally heated to dry on a hot-plate or the like. The coating solution may be beforehand filtrated through a filter. This filtration of the coating solution can suppress formation of defects so as to make it easy to carry out the defect treatment conducted later.

After that, if necessary, the second intermediate layer is formed by a process selected from those described for the first intermediate layer. The light-emitting device may comprise two second intermediate layers, which are the electron transport layer and the electron injection layer. Even so, each of them can be formed by a process properly selected.

The counter electrode is formed by vacuum deposition, sputtering, ion-plating, normal plating, wet-coating or the like.

It is often the case that the sealing layer is formed on the photoelectric conversion device. In the embodiment, the defect treatment described below may be carried out either before or after the sealing layer is formed on the counter electrode. However, the sealing layer is relatively strong and hence it may be difficult to remove the defects together with the sealing layer. Further, the cavities formed by removing the defects can be filled with the material of the sealing layer to improve durability of the device and to reduce the risk of short-circuit. In view of those, the sealing layer is formed preferably after the defect treatment.

(Defect Treatment)

The defect treatment can be carried out in the same manner whether the device is a solar cell or a light-emitting device. The procedure for treating defects in a solar cell is explained below as an example.

Figure 7:
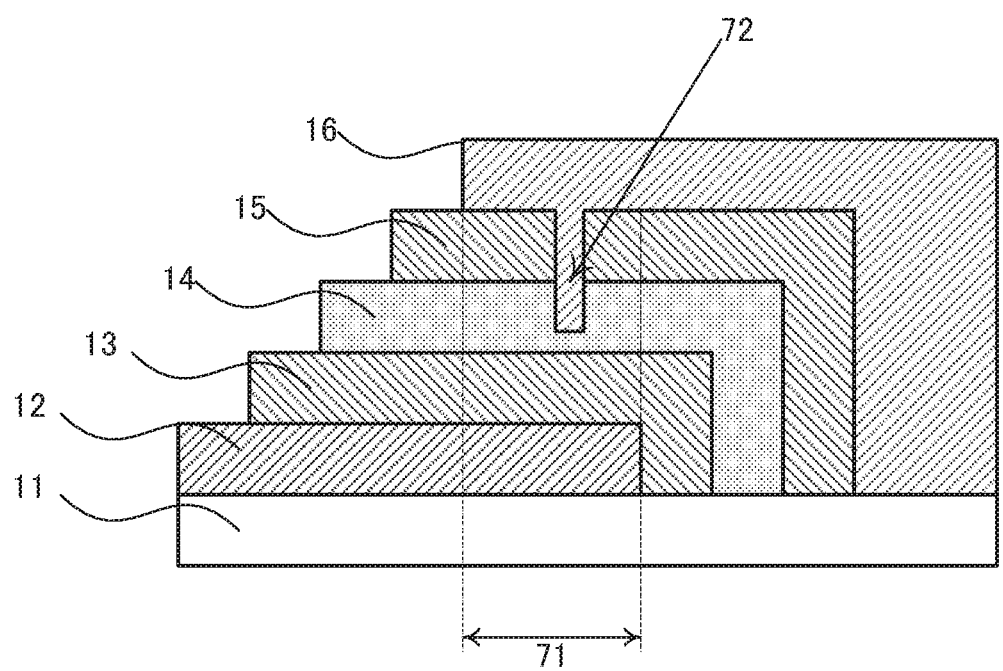
FIG. 7 is a schematic sectional view of a device having defects.

As described above, first a perovskite solar cell is produced according to a usual method. If the produced cell is visually observed while the back surface thereof is kept irradiated with light, it can be found that there are some spots of high transmittance in the power generation area. Those spots correspond to defects. FIG. 7 is a schematic sectional view of the device. For example, if the device is a solar cell, it comprises a substrate 11, a transparent electrode 12, a first intermediate layer 13, a photoelectric conversion layer 14, a second intermediate layer 15, and a counter electrode 16, stacked in this order. Electricity is generated in an area 71, where the transparent electrode, the photoelectric conversion layer and the counter electrode are laid parallel. That area is referred to as "power generation area". The structure schematically shown in the drawing has a cavity 72 which penetrates to the photoelectric conversion layer through the upper layer. If a defect is formed in a formation process of the photoelectric conversion layer, a leak often occurs at the defect to impair the generation efficiency not only at the defect but also around the defect. The structure at the defect is different from that in the other area, and hence the transmittance is peculiarly high at the defect position.

The defects impair the generation efficiency, and accordingly they are treated (removed) to improve or recover the properties of the device.

Where the defects are positioned can be determined by means of a defect-position determining unit, in which, for example, a CCD camera equipped with lenses can be scanningly moved by a motor-driven XY stage.

After the positions of defects are determined, the defects and their peripheral parts are removed by, for example, an adhesive method (tape method) or a suction method.

Figure 8A:
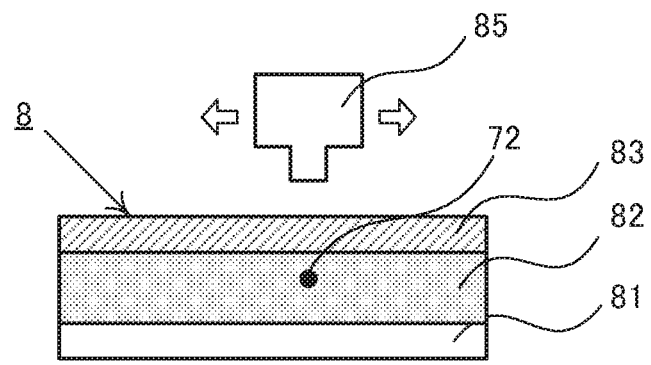
FIGS. 8A to 8C schematically illustrate a process for treating a defect according an adhesive method.
Figure 8B:
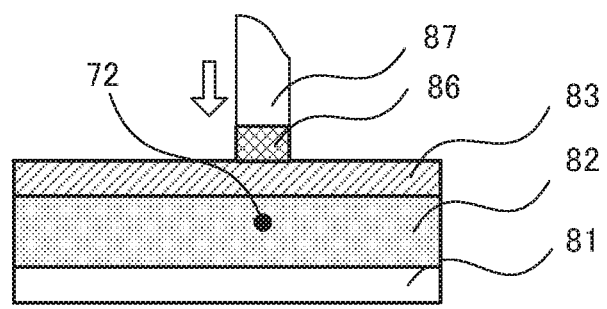
Figure 8C:
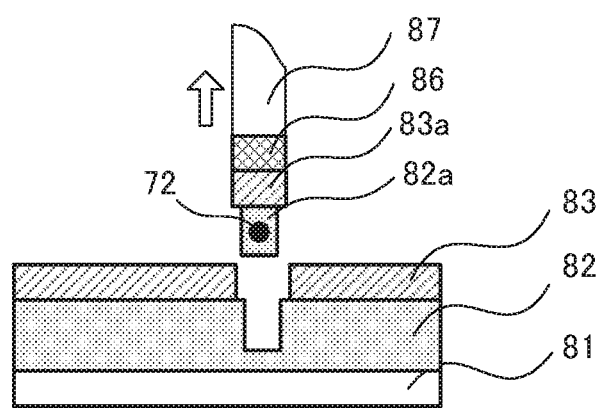

For example, in order that the defects can be removed by a combination of the defect-position determining unit and the adhesive method, it is possible to adopt a process shown in FIGS. 8A to 8C.

First, a transparent electrode 81, an active layer 82, and a counter electrode 83 are stacked according to a desired method to produce a device 8. The produced device generally contains defects 72 dispersed in the active layer. The device is then placed in the defect-position determining unit, and the positions of the defects 72 are determined with, for example, a CCD camera 85 (FIG. 8A).

After the defect positions are thus determined in the above manner, the defects at the determined positions and their peripheral parts are removed by a defect-removing unit.

Specifically, an adhesive material 86 such as an adhesive tape is pressed and attached to the counter electrode at the defects and their peripheral parts (FIG. 8B). As the adhesive material, materials having proper adhesion can be employed. For example, normal adhesive tapes and glues are usable. Further, adhesive polymers can be adopted. The adhesive material is preferably loaded on a proper support 87.

As for the relation between the defect size and the device properties, the larger the defect size is, the worse the device properties become. Specifically, if having a diameter of 100 μm or more, the defect is very likely to impair the properties. Further, even if having a diameter of only 10 μm or more, the defect may cause unfavorable effects on the properties occasionally depending on the shape or position thereof. Accordingly, large defects should be preferentially removed, and further defects having diameters of only 10 μm or more are preferably also removed. It is sometimes the case that a photoelectric conversion device produced by a usual method contains such a large defect as to have a diameter of about 1 mm. In view of that, the removal area is generally set to be 4 mm² or less.

Subsequently, the adhesive material 86 is peeled off (FIG. 8C). In this procedure, a part 83a of the counter electrode and a part 82a just thereunder of the active layer are removed. If the second intermediate layer is provided, the counter electrode, the second intermediate layer and the active layer are partly removed. As a result, the defect and its peripheral part are thus removed to form a cavity.

Those procedures of moving the adhesive material to the defect position, of attaching it thereto and of peeling off the material therefrom are, for example, carried out by use of a motor-driven XY stage.

The following is thought to be the reason why the defect, together with a part of the counter electrode, can be removed by the above method.

The counter electrode is formed at a low temperature if a low heat-resistant organic substrate is employed. In that case, the counter electrode and the adjacent layer are generally weakly bonded to each other. Accordingly, when the adhesive material is peeled off, the counter electrode is readily removed. Meanwhile, defects are generally formed because of coating unevenness or the like when the active layer is formed, and hence the density is low at the defects and their peripheral parts. Those low-density parts are weakly unified with the surrounding active layer, and therefore are easily separated therefrom when stress is applied thereon. Consequently, the defects and their peripheral parts are removed together with the counter electrode. In this way, the structure shown in FIG. 1 is produced.

For the same reason, the treatment can be carried out according to a suction method in which an aspirator is used in the defect-removing unit. Specifically, the aspiration nozzle is pointed at a defect, which is then sucked to remove. Thus, the counter electrode is partly removed together with the defect and its peripheral part.

If formed at a high temperature, the counter electrode is strongly bonded to the adjacent layer by the anchor effect and the like. In that case, it is often difficult to remove the counter electrode according to the tape or suction method. Accordingly, the present method is particularly effective in producing a film-layered device at a low temperature. This means that the present method is suitable for manufacturing perovskite solar cells, organic thin-film solar cells, and organic electroluminescent devices.

The treatment according to a conventional method, such as a mechanical scribing or laser scribing method, has some risks. For example, the substrate may be damaged in the treatment, fine shavings produced in the scribing treatment may remain to cause troubles, and the treatment may raise the cost. In contrast, the method according to the embodiment reduces those risks. Further, the structure formed according to the embodiment has a stepwise difference, and the counter electrode in the structure has such a large opening as is enough separated from the opening of the active layer. Because of that, the risk of short-circuit is further reduced.

In addition, if the sealing layer is formed after the defect treatment, the cavity formed by the treatment is filled with an insulating resin. As a result, the risk of short-circuit is furthermore reduced.

EXAMPLES

The embodiments are further explained in detail by the following examples.

Example 1

In Example 1, a perovskite solar cell is explained as an example. The solar cell described here comprised the following component members:
substrate: PEN,
transparent electrode: ITO,
first intermediate layer (hole transport layer): PEDOT: PSS,
active layer (photoelectric conversion layer): perovskite compound,
second intermediate layer (electron transport layer): 60PCBM, and
counter electrode: Ag.

First, a PEN film was placed on a highly rigid support, and then an ITO layer was formed thereon. Specifically, a PEN film of 125 μm thickness was laminated via an adhesive layer on a glass substrate as a support. The adhesive layer had a property of losing the adhesion force at a low temperature.

Subsequently, a 150-nm thick layer of amorphous-phase ITO was formed on the laminated PEN film by sputtering at 60° C. Since the temperature was set at 60° C., the PEN film was scarcely damaged. The ITO layer was formed so that the weight ratio of In/Sn might be 24 (In:Sn=96 mass %:4 mass %). The In/Sn weight ratio was calculated from measurement results of energy dispersive X-ray spectrometry (EDS, measurement system: SU8020 ([trademark], manufactured by Hitachi High-Technologies Corporation) and EDAX OCTANE SUPER ([trademark], manufactured by AMETEK, Inc.; condition: accelerating voltage=15 kV). The obtained PEN film/amorphous-phase ITO layer was annealed in air at 150° C. for 1 hour, and then subjected to out-of-plane X-ray diffraction measurement with an X-ray diffraction system (SmartLab [trademark], manufactured by Rigaku Corporation) under the condition of incident Soller 5.0°. As a result, the peaks assigned to the crystal phase were observed at about 21°, 31°, 35°, 42°, 46° and 51°. Form them, it was found that the amorphous phase was converted into the crystal phase.

The ITO substrate was then irradiated with ultraviolet ozone (UV-$O_3$) to remove organic contaminants attached on the surface thereof.

Thereafter, 1 mL of pure water was added to 1 mL of PEDOT:PSS to prepare a hole transport layer solution. The prepared solution was dropped onto the ITO substrate through a filter of 0.45 μm pore diameter, and then spin-coating was carried out at 4000 rpm for 30 seconds to form a hole transport layer. As the PEDOT:PSS, AI4083 ([trademark], manufactured by Heraeus GmbH) was adopted. Successively, the ITO substrate was heated in air at 140° C. for 10 minutes to remove excess solvent.

Then, a perovskite-material dispersion was prepared by adding 178 mg of methylammonium iodide ($CH_3NH_3I$) and 515 mg of lead iodide ($PbI_2$) into 1 mL of dimethylformamide (DMF). The prepared perovskite solution was applied by spin-coating and dried to form a photoelectric conversion layer. The spin-coating application was carried out at 5000 rpm for 45 seconds. During the spin-coating application, the coating film of the perovskite solution was blown with nitrogen gas to accelerate drying. That is because the perovskite layer can be eventually formed more homogeneously by nitrogen blowing than by natural drying. The coating film was then heated at 70° C. for 2 hours to promote crystallization in the perovskite layer and thereby to form a photoelectric conversion layer.

After that, 20 mg of 60PCBM was added to 1 mL of monochlorobenzene and stirred to prepare a 60PCBM solution. The prepared solution was applied by spin-coating on the photoelectric conversion layer, and then naturally dried in a nitrogen atmosphere to form an electron transport layer of 100 nm thickness. Subsequently, an Ag layer of about 60 nm thickness was formed by vacuum deposition to produce a counter electrode.

The conversion efficiency of the thus produced photoelectric conversion device was measured and found to be 1.0% (backward scanning). The measurement was carried out by means of a solar simulator at an irradiance of 100 W/$cm^2$ on the basis of the reference spectrum of air mass (AM) 1.5 G.

An appearance of the obtained device was observed, so that it was found that there was a defect in a visually observable size. At the position of the defect, the ITO and Au layers are presumed to be locally close with a peculiarly short distance.

The defect was subjected to the treatment. Specifically, an adhesive tape of about 2-mm square was attached on the defect part and then peeled off. The area from which the tape was peeled off was observed. As a result, it was found that the Au electrode was partly removed, that the lacked electrode part was in a shape corresponding the peeled tape and that the electron transport layer was partly bared. The removed area of the electron transport layer was smaller than that of the Au electrode, and the active layer was partly exposed to the bottom of the formed cavity.

The opening edge of the Au electrode was separated from that of the electron transport layer with a distance of about 0.5 mm, which was enough to reduce the risk of short-circuit.

Figure 9:
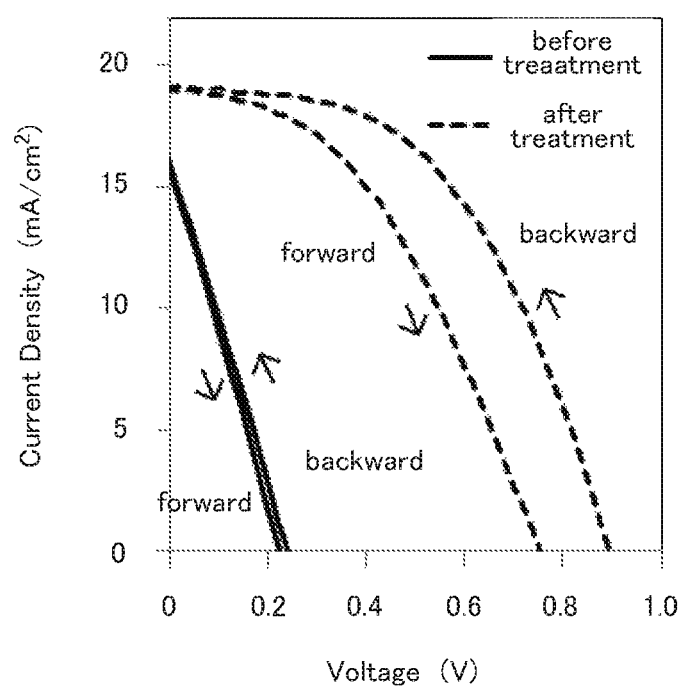
FIG. 9 is an I-V graph showing the effect of defect treatment in Example 1.

With respect to the device thus subjected to the defect treatment, the conversion efficiency was measured again. As a result, the conversion efficiency was found to be improved from 1.0% (backward scanning) to 8.6% (backward scanning) (FIG. 9). Further, the open circuit voltage and the fill factor were also found to be improved from 0.23 V to 0.89 V and from 0.26 to 0.50, respectively.

Example 2

In Example 2, an organic thin-film solar cell is explained as an example. The solar cell described here comprised the following component members:
substrate: PEN,
transparent electrode: ITO, first intermediate layer (hole transport layer): PEDOT:PSS, active layer (photoelectric conversion layer): mixture of PTB7-Th and 70PCBM, second intermediate layer (electron transport layer): LiF, and counter electrode: Ag.

The substrate, transparent electrode and hole transport layer were the same as those in Example 1.

Subsequently, an organic thin-film material solution for forming the photoelectric conversion layer was prepared by: adding 8 mg of PTB7-Th and 12 mg of 70PCBM into 1 mL of a mixture of chlorobenzene:1,8-diiodooctane=97 vol %:3 vol %, The solution was applied by spin-coating and dried to form a photoelectric conversion layer. The spin-coating application was carried out at 7000 rpm for 30 seconds.

Thereafter, a lithium fluoride layer of about 1 nm thickness was formed by vacuum deposition to produce a electron transport layer. Then, an Ag layer of about 150 nm thickness was formed by vacuum deposition to produce a counter electrode.

The conversion efficiency of the thus produced photoelectric conversion device was measured and found to be 0.2%.

An appearance of the obtained device was observed, so that it was found that there was a defect in a visually observable size. The defect was subjected to the treatment in the same manner as that in Example 1, and thereby the conversion efficiency was improved to 4.9%.

Example 3

In Example 3, an OLED is explained as an example. The OLED described here comprised the following component members:

substrate: PEN,
anode: ITO,
hole transport layer: PEDOT:PSS,
luminous layer: Alq3,
electron injection layer: LiF, and
counter electrode: Ag.

The substrate, transparent electrode and hole transport layer were the same as those in Example 1.

Subsequently, the luminous layer was formed by spin-coating. The solution for forming the luminous layer was prepared by dissolving Alq3 in chloroform. The concentration of Alq3 was 1 wt %.

The prepared solution was dropped to the substrate through a filter of 0.20 µm pore diameter, and then spin-coating was carried out at 3000 rpm for 30 seconds to form a luminous layer.

The obtained substrate was then placed in a vacuum deposition apparatus, and subjected to heating vacuum deposition of LiF and Al to form LiF and Al layers of 1 nm and 100 nm thicknesses, respectively. The LiF and Al layers served as an electron injection layer and a counter electrode, respectively.

The property of the produced OLED was evaluated. As a result, the device showed a luminance value of 50 cd/m$^2$ under application of 4 V.

An appearance of the obtained device was observed, so that it was found that there was a defect in a visually observable size. The defect was subjected to the treatment in the same manner as that in Example 1, and thereby the luminance value was improved to 2000 cd/m$^2$ under application of 4 V.

As described above, according to the present embodiments and examples thereof, it becomes possible to provide flexible, light-weight, efficient and low-cost photoelectric conversion devices, such as, solar cells, light-emitting devices, photosensors, photodiodes and optical memories. Further, a plural number of those devices can be arranged to produce a photovoltaic module. Furthermore, according to the method of the present embodiment, it becomes possible to improve the production yield of defect treatment applied to photoelectric conversion devices comprising substrates made of physically and thermally weak organic materials.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A method for manufacturing a photoelectric conversion device, the method comprising:
forming a laminate structure of
a substrate,
a transparent electrode comprising indium tin oxide,
an active layer produced by wet-coating, and
a counter electrode, stacked in this order; and thereafter
forming a cavity by
(a) pressing an adhesive material just against a defect formed on a surface of said counter electrode, and then peeling off said adhesive material together with said defect and a peripheral part of said defect; or
(b) sucking a defect formed on the surface of said counter electrode, so as to remove said defect and a peripheral part of said defect,
wherein said cavity penetrates through the counter electrode and unreached to the transparent electrode,
wherein said method further comprises:
depositing indium tin oxide on said substrate at a temperature of 100° C. or below; and then;
annealing at a temperature of 200° C. or below and
wherein said cavity has an opening area larger in said counter electrode than in said active layer and is 1 mm$^2$ or more and 4 mm$^2$ or less.

2. The method according to claim 1, wherein a weight ratio of In/Sn of said indium tin oxide is 24 or more.

3. The method according to claim 1, further comprising:
forming an intermediate layer between said active layer and said counter electrode.

4. The method according to claim 1, wherein said substrate is made of a flexible organic material.

5. The method according to claim 4, wherein said flexible organic material is selected from the group consisting of polyethylene naphthalate, polyethylene terephthalate, polyethylene, polyimide, polyamide, polyamide-imide, polyester, polycycloolefin, and liquid crystal polymer.

6. The method according to claim 1, wherein said active layer comprises a perovskite compound.

7. The method according to claim 1, wherein said active layer has a heterojunction or bulkheterojunction structure comprising an organic substance.

8. The method according to claim 1, further comprising:
forming a sealing layer placed on said counter electrode.

9. The method according to claim 8, wherein said cavity is inlaid with said sealing layer.

10. The method according to claim 1, wherein said photoelectric conversion device is selected from the group consisting of a solar cell, a light-emitting device, a photo-sensor, a photodiode, and an optical memory.

\* \* \* \* \*